US006956760B2

United States Patent
Kang (10) Patent No.: US 6,956,760 B2
(45) Date of Patent: Oct. 18, 2005

(54) FERROELECTRIC RANDOM ACCESS MEMORY

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/737,845

(22) Filed: Dec. 18, 2003

(65) Prior Publication Data

US 2005/0024915 A1 Feb. 3, 2005

(30) Foreign Application Priority Data

Jul. 30, 2003 (KR) ................................ 10-2003-0052663

(51) Int. Cl.$^7$ ............................................... G11C 11/22
(52) U.S. Cl. .............. 365/145; 365/230.03; 365/230.06
(58) Field of Search ............................ 365/145, 230.03, 365/230.06, 156, 190, 191

(56) References Cited

U.S. PATENT DOCUMENTS 6,067,244 A    5/2000  Ma et al.
6,272,594 B1   8/2001  Gupta
6,301,145 B1  10/2001  Nishihara
6,314,016 B1  11/2001  Takasu
6,363,439 B1   3/2002  Battles et al.
6,574,135 B1 * 6/2003  Komatsuzaki ............... 365/145
6,771,531 B2 * 8/2004  Nishihara ................... 365/145

FOREIGN PATENT DOCUMENTS

KR    1020040059009 A    7/2004

* cited by examiner

Primary Examiner—Richard Elms
Assistant Examiner—Pho M. Luu
(74) Attorney, Agent, or Firm—Heller Ehrman LLP (57) ABSTRACT

A ferroelectric random access memory (FeRAM) which can embody a high integration cell by sharing a plate line in sub cell array block units is provided. In a read operation mode, the FeRAM stores read data from a cell array block in a timing data register array unit through a common data bus unit, and in a write operation mode, the FeRAM stores read data stored in the timing data register array unit or data inputted from a timing data buffer unit in the cell array block through the common data bus unit.

20 Claims, 12 Drawing Sheets

FERROELECTRIC RANDOM ACCESS MEMORY

BACKGROUND OF THE INVENTION

1. Field of the Invention

The present invention relates to a ferroelectric random access memory (FeRAM), and more particularly to an FeRAM which can embody a high integration cell by improving a plate line structure of a cell array block in a semiconductor memory device.

2. Description of the Background Art

In general, an FeRAM has a data processing speed equivalent to a dynamic random access memory (DRAM), preserves data even when power is off, and thus gains popularity as a next generation memory.

The FeRAM is a memory having an extremely-similar structure to the DRAM. The FeRAM employs a ferroelectric substance to form capacitors, and thus uses high remanent polarization which is a property of the ferroelectric substance. Even if electric fields are removed, data are not deleted in the FeRAM due to the remanent polarization.

The technical descriptions of the FeRAM have been disclosed in Korea Patent application No. 2002-85533 by the same inventors as the present invention. Therefore, detailed explanations of the basic structure and operation principles of the FeRAM are omitted.

As a design rule of a semiconductor memory device decreases, a size of an FeRAM cell gradually decreases. When different plate lines are used in each row of a cell array, a cell area is not reduced. Especially in the case of a three-dimensional cell, it is much more difficult to distinguish plate lines by cell arrays. Accordingly, high integration of the cell is not achieved.

In addition, when the plate lines are etched in the FeRAM, a ferroelectric substance is exposed to plasma atmosphere, and thus a ferroelectric film is deteriorated by plasma damages. Therefore, the FeRAM is not efficiently crystallized, and properties thereof become inhomogeneous according to cell distribution in the cell array.

SUMMARY OF THE INVENTION

The present invention is achieved to solve the above problems. Accordingly, it is an object of the present invention to embody a high integration cell by sharing a plate line in a sub cell array block unit.

In order to achieve the above-described object of the invention, there is provided a ferroelectric random access memory including a unit sub cell array in which a plurality of sub bit lines are connected to one main bit line and a plurality of unit cells are connected respectively to the sub bit lines, wherein each of the unit cells of the unit sub cell array shares a plate line.

According to one aspect of the invention, a ferroelectric random access memory includes: a cell array block having a plurality of sub cell array blocks to which a plate line is commonly connected; and a plate line driving unit formed in one side of the plurality of sub cell array blocks, for driving the plate line in one sub cell array block unit by controlling decoding of the plate line.

According to another aspect of the invention, a plurality of unit sub cell arrays include sub bit lines connected to a plurality of unit cells and a main bit line, and compose one sub cell array block. The unit sub cell array includes a plurality of bottom electrodes connected to storage nodes of switching devices included in the plurality of unit cells; a ferroelectric layer stacked on the whole surface of the plurality of bottom electrodes; a top electrode stacked on the ferroelectric layer; and a plate line stacked to be electrically connected to a predetermined area of the top electrode through a contact plug.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An FeRAM in accordance with a preferred embodiment of the present invention will now be described in detail with reference to the accompanying drawings.

Figure 1:
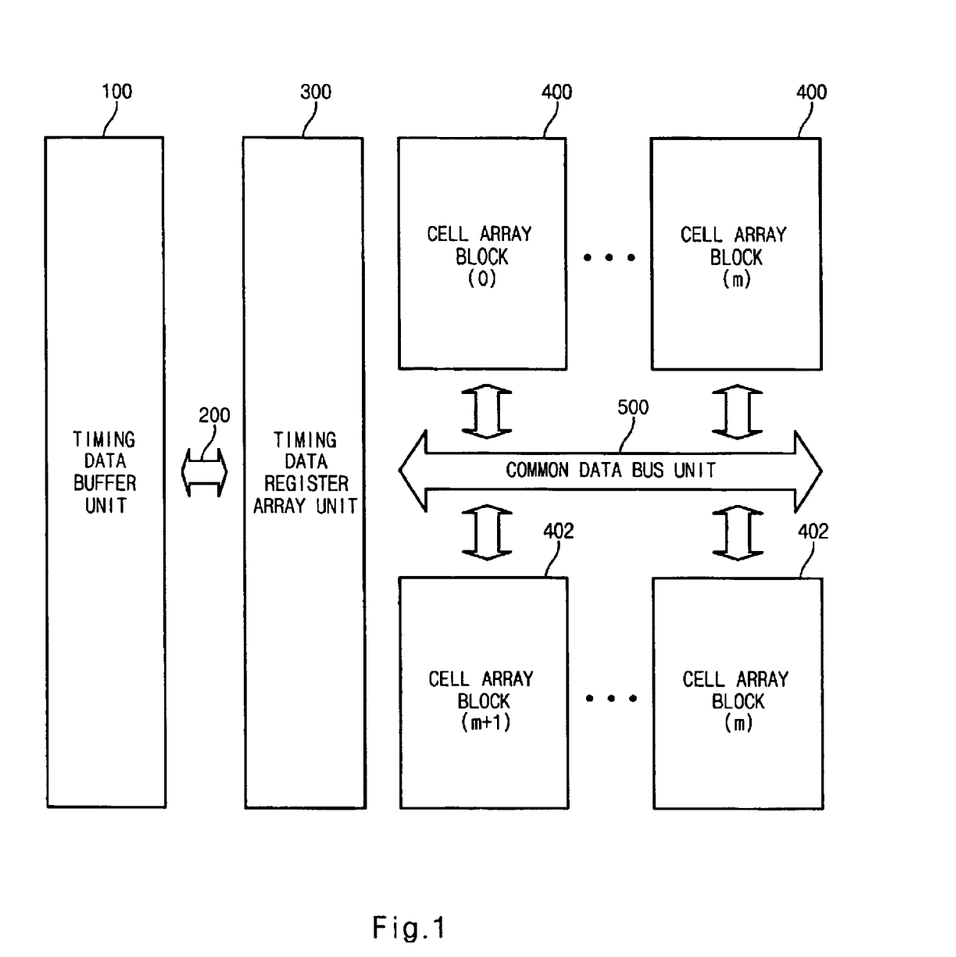
FIG. 1 is a structure diagram illustrating an FeRAM in accordance with the present invention.

FIG. 1 is a structure diagram illustrating the FeRAM in accordance with the present invention.

The FeRAM includes a timing data buffer unit 100, a data buffer bus unit 200, a timing data register array unit 300, a plurality of cell array blocks 400 and 402, and a common data bus unit 500.

The cell array blocks 400 and 402 have a plurality of cell arrays for storing data. Especially, the plurality of cell array blocks 400 are arranged on the upper portion of the common data bus unit 500, and the plurality of cell array blocks 402 are arranged on the lower portion of the common data bus unit 500. In addition, the plurality of cell array blocks 400 and 402 share the common data bus unit 500.

Each of the cell array blocks 400 includes a bit line cell array having sub bit lines and a main bit line, and inducing a sensing voltage of the main bit line by converting a sensing voltage of the sub bit lines into current.

The timing data buffer unit 100 is connected to the timing data register array unit 300 through the data buffer bus unit 200. When sensing the data of the common data bus unit 500, the timing data register array unit 300 distinguishes data high and data low on the basis of the time when a voltage level of the data passes a sensing threshold voltage.

In a read operation mode, data read from the cell array blocks 400 are stored in the timing data register array unit 300 through the common data bus unit 500. The read data stored in the timing data register array unit 300 are outputted to the timing data buffer unit 100 through the data buffer bus unit 200.

Conversely, in a write operation mode, data inputted through the timing data buffer unit 100 are stored in the timing data register array unit 300 through the data buffer bus unit 200. The input data or read data stored in the timing data register array unit 300 are written on the cell array blocks 400 through the common data bus unit 500.

Figure 2:
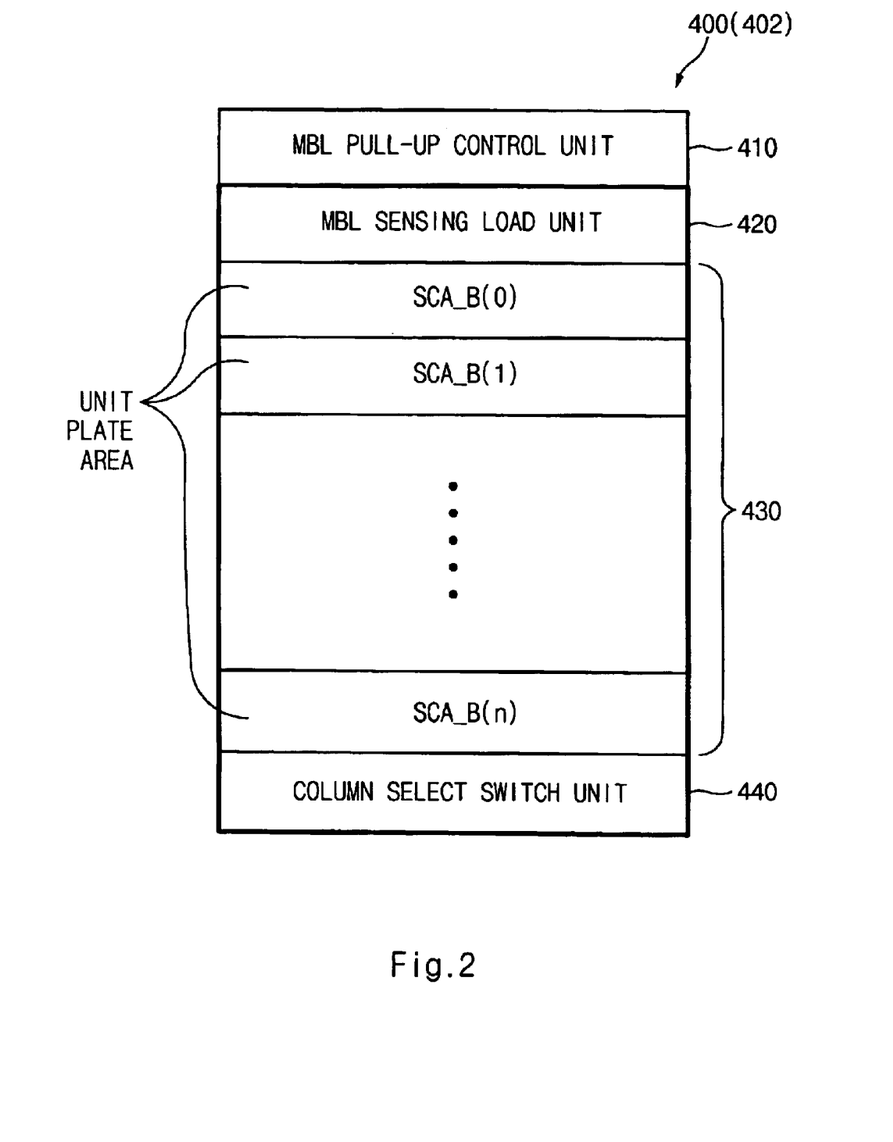
FIG. 2 is a detailed structure diagram illustrating a cell array block of FIG. 1.

FIG. 2 is a detailed structure diagram illustrating the cell array block 400 of FIG. 1.

The cell array block 400 includes a main bit line pull-up control unit 410, a main bit line sensing load unit 420, a plurality of sub cell array blocks 430 and a column select switch unit 440.

Here, the main bit line MBL of the plurality of sub cell array blocks 430 is connected to the common data bus unit 500 through the column select switch unit 440. Each of the sub cell array blocks 430 shares a plate area on the basis of the cell connected to the sub bit line SBL in sub cell array block SCA_B units.

Figure 3:
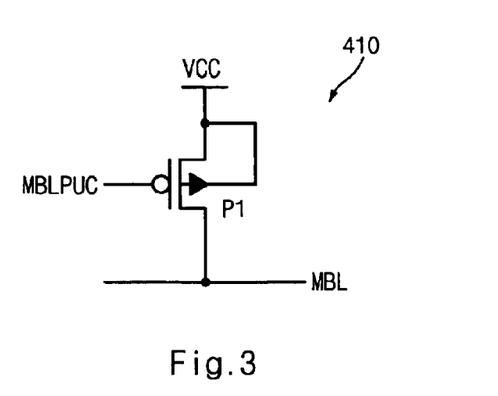
FIG. 3 is a detailed circuit diagram illustrating a main bit line pull-up control unit of FIG. 2.

FIG. 3 is a detailed circuit diagram illustrating the main bit line pull-up control unit 410 of FIG. 2.

The main bit line pull-up control unit 410 includes a PMOS transistor P1 for pulling up the main bit line MBL in precharge. The PMOS transistor P1 has its source terminal connected to a power voltage VCC terminal, its drain terminal connected to the main bit line MBL, and its gate terminal to receive a main bit line pull-up control signal MBLPUC.

Figure 4:
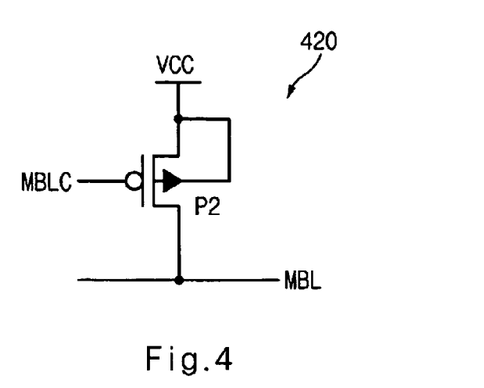
FIG. 4 is a detailed circuit diagram illustrating a main bit line sensing load unit of FIG. 2.

FIG. 4 is a detailed circuit diagram illustrating the main bit line sensing load unit 420 of FIG. 2.

The main bit line sensing load unit 420 includes a PMOS transistor P2 for controlling a sensing load of the main bit line MBL. The PMOS transistor P2 has its source terminal connected to the power voltage VCC terminal, its drain terminal connected to the main bit line MBL, and its gate terminal to receive a main bit line control signal MBLC.

Figure 5:
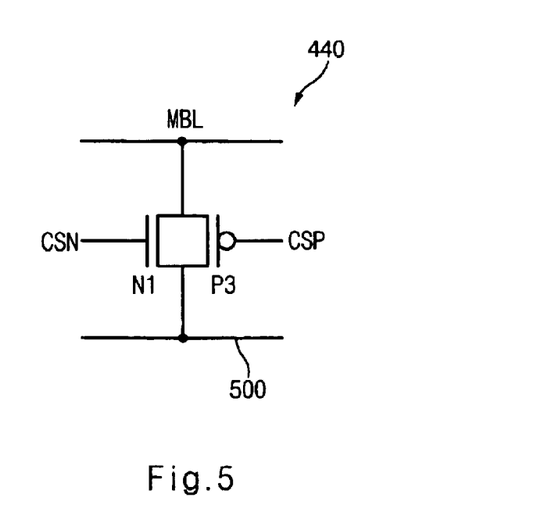
FIG. 5 is a detailed circuit diagram illustrating a column select switch unit of FIG. 2.

FIG. 5 is a detailed circuit diagram illustrating the column select switch unit 440 of FIG. 2.

The column select switch unit 440 includes an NMOS transistor N1 and a PMOS transistor P3. Here, the NMOS transistor N1 is connected between the main bit line MBL and the common data bus unit 500, and has its gate terminal to receive a column select signal CSN. The PMOS transistor P3 is connected between the main bit line MBL and the common data bus unit 500, and has its gate terminal to receive a column select signal CSP.

Figure 6:
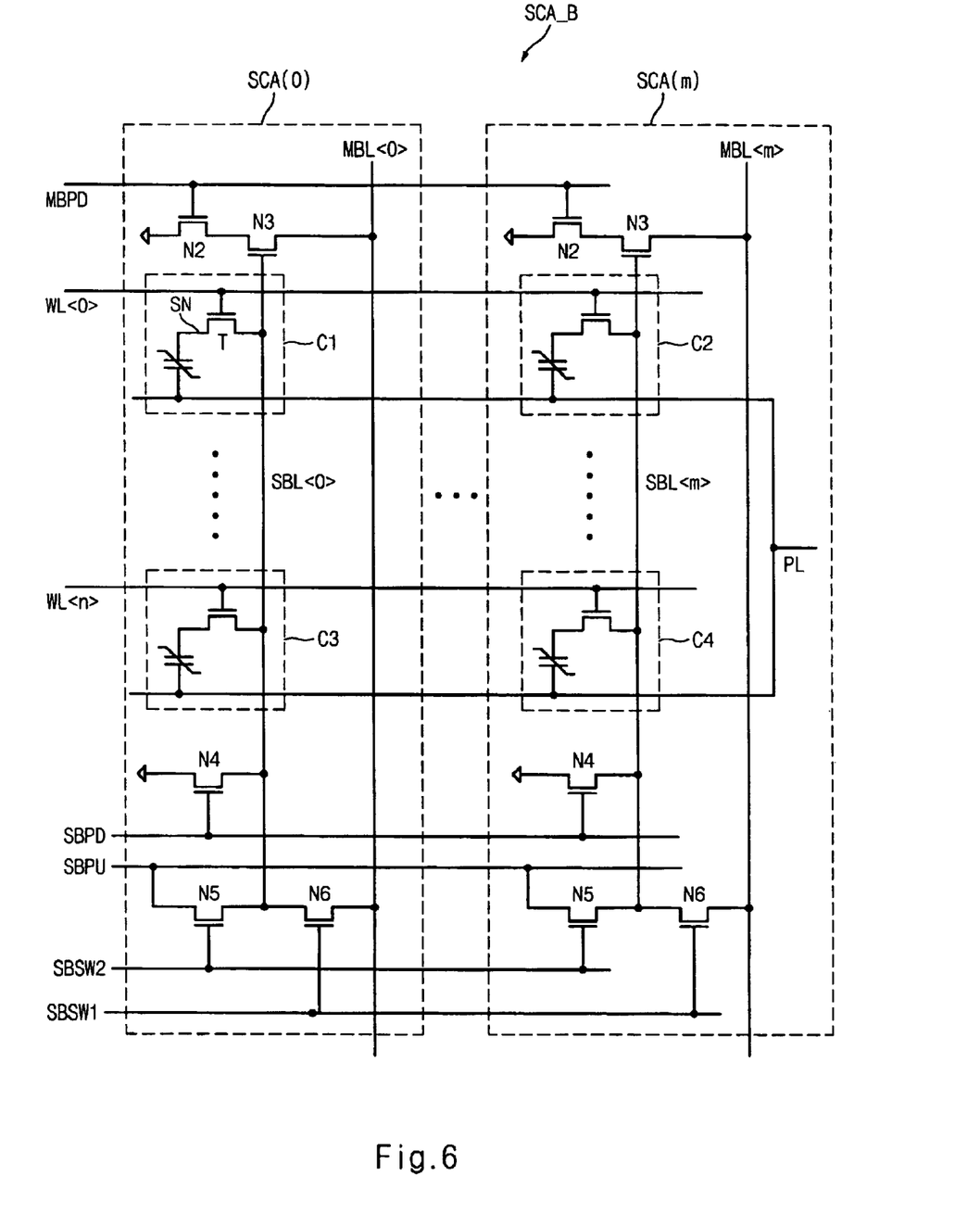
FIG. 6 is a detailed circuit diagram illustrating a sub cell array block of FIG. 2.

FIG. 6 is a detailed circuit diagram illustrating the sub cell array block 430 of FIG. 2.

The sub cell array block 430 includes a plurality of sub cell array blocks SCA_B. One sub cell array block SCA_B has a plurality of unit sub cell arrays SCA in the row direction.

Here, each of the main bit lines MBL of the sub cell array blocks SCA_B is selectively connected to one of the plurality of sub bit lines SBL. That is, when one of a plurality of sub bit line select signals SBSW1 is activated, a corresponding NMOS transistor N6 is turned on to enable one sub bit line SBL. A plurality of cells C1 and C3 are connected to one sub bit line SBL<0>, and a plurality of cells C2 and C4 are connected to one sub bit line SBL<m>.

When a sub bit line pull-down signal SBPD is activated and an NMOS transistor N4 is turned on, the sub bit line SBL is pulled down to a ground level. A sub bit line pull-up signal SBPU controls power supplied to the sub bit line SBL. That is, a higher voltage than the power voltage VCC is generated in a low voltage, and supplied to the sub bit line SBL.

A sub bit line select signal SBSW2 controls connection between the sub bit line pull-up signal SBPU terminal and the sub bit line SBL according to switching of an NMOS transistor N5.

In addition, an NMOS transistor N3 is connected between an NMOS transistor N2 and the main bit line MBL, and has its gate terminal connected to the sub bit line SBL. The NMOS transistor N2 is connected between the ground voltage terminal and the NMOS transistor N3, and has its gate terminal to receive a main bit line pull-down signal MBPD, for controlling the sensing voltage of the main bit line MBL.

The sub cell array block 430 shares the plate line PL in one sub cell array block SCA_B. For example, the plurality of unit cells C1~C4 of the sub cell array block SCA_B share the plate line PL. Here, when one word line WL<0> is activated, the unit cells C1 and C2 connected to the same word line WL<0> are activated at the same time, and the unit cells C3 and C4 connected to the other word lines WL<n> are inactivated.

Figure 7:
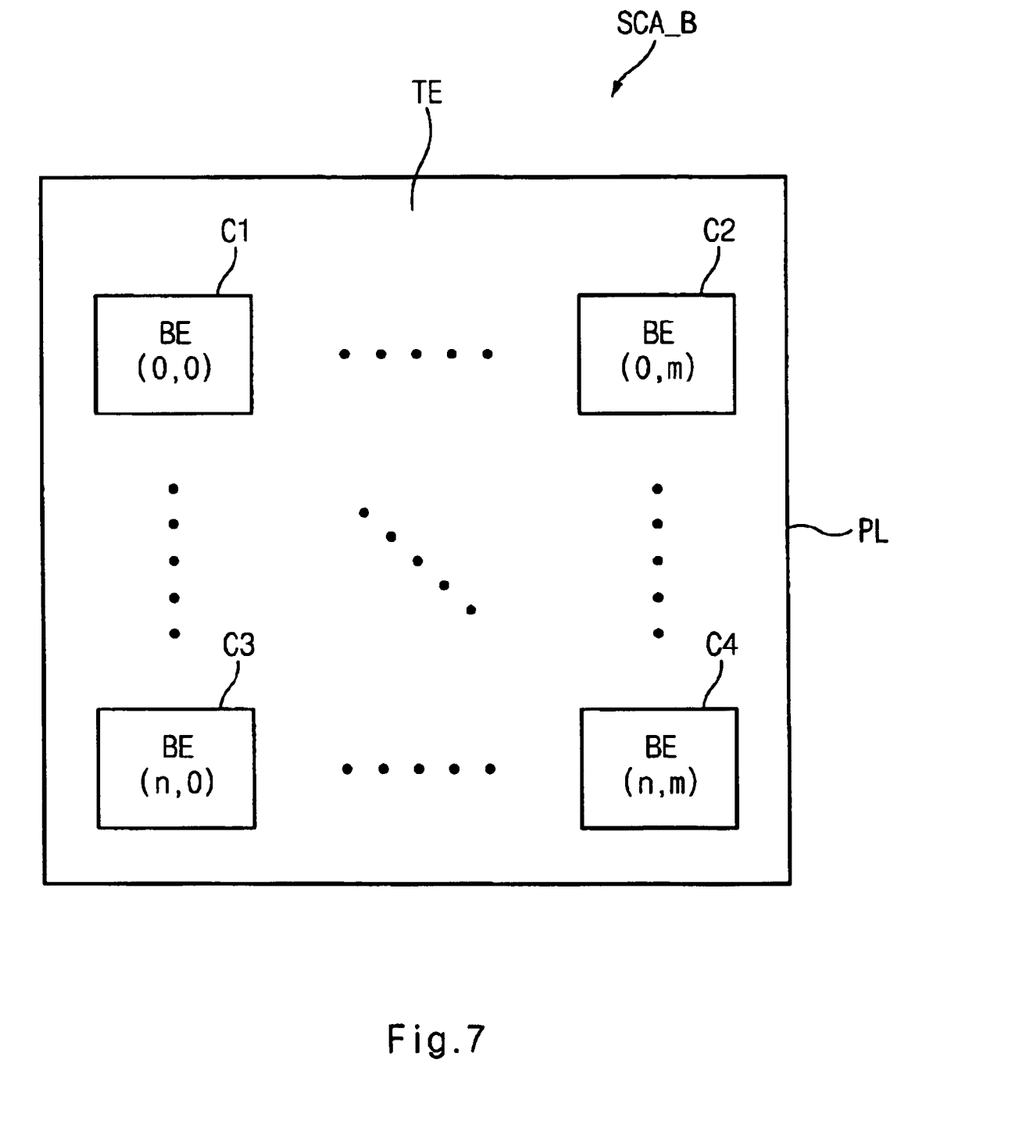
FIG. 7 is a layout structure diagram illustrating the sub cell array block of FIG. 6.

FIG. 7 is a layout structure diagram illustrating the sub cell array block SCA_B of FIG. 6.

In the sub cell array block SCA_B, the plurality of unit cells C1~C4 arranged in the column and row directions share one plate line PL. Top electrodes TE of the plurality of unit cells C1~C4 are commonly connected to one plate line PL. Bottom electrodes BE of the plurality of unit cells C1~C4 are formed in each unit cell C1~C4 one by one.

Figure 8:
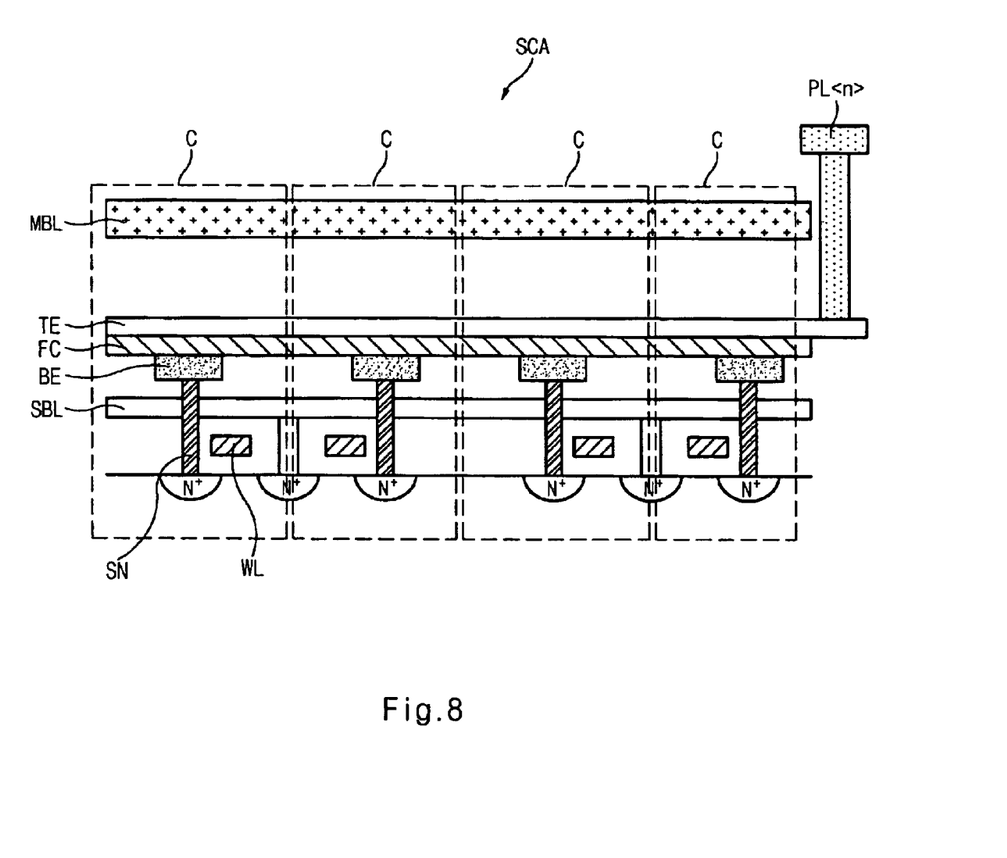
FIG. 8 is a cross-sectional diagram illustrating a process of a unit sub cell array of FIG. 6.

FIG. 8 is a cross-sectional diagram illustrating a process of the unit sub cell array SCA of FIG. 6.

One end of a transistor T of a unit cell C is connected to a storage node SN, the other end of the transistor T is connected to the sub bit line SBL, and a gate terminal of the transistor T is connected to the word line WL. A bottom electrode BE of a ferroelectric layer FC is formed on the storage node SN.

A top electrode TE is formed on the ferroelectric layer FC, and the main bit line MBL is formed on the top electrode TE. One plate line PL connected to the top electrode TE and a plate line PL driving unit discussed later is formed in one side end of the top electrode TE.

Here, one bottom electrode BE is formed in every unit cell C, and one top electrode TE connected to one plate line PL is commonly connected to the plurality of unit sub cell arrays SCA.

Figure 9:
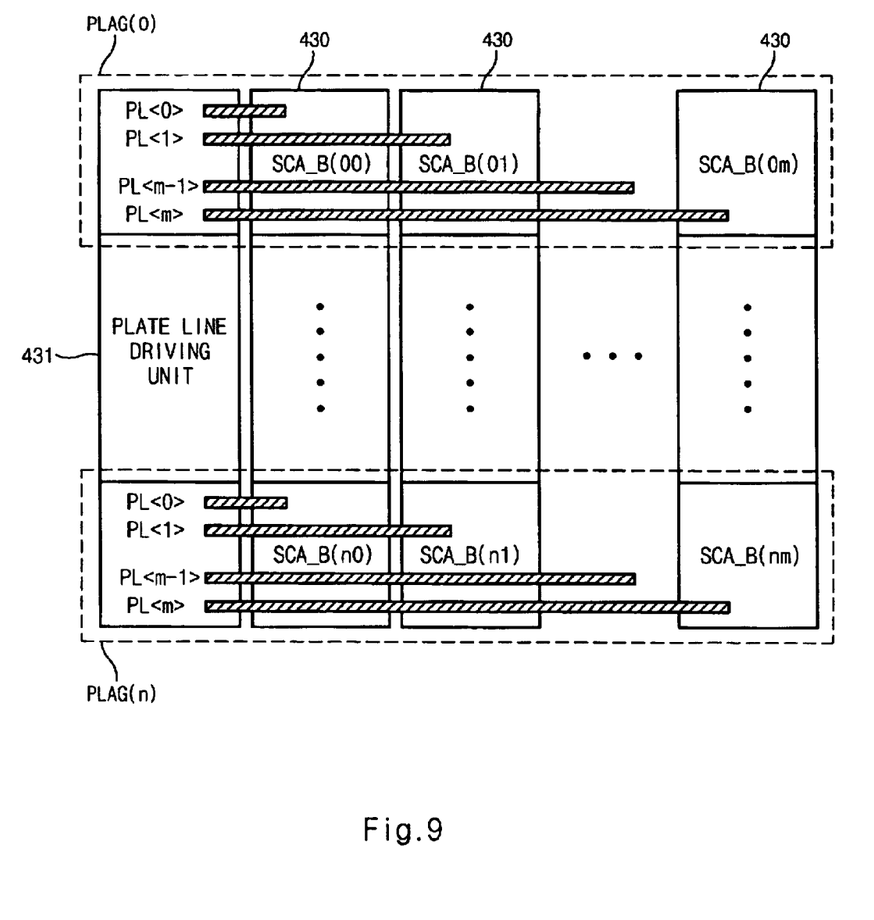
FIGS. 9 to 12 are structure diagrams illustrating a plate line and word line array in the sub cell array block in accordance with the present invention.

FIG. 9 is a structure diagram illustrating a plate line PL array in the sub cell array block 430 in accordance with the present invention.

A plurality of sub cell array blocks SCA_B are arranged in the plurality of sub cell array blocks 430 in the row and column directions. One sub cell array block SCA_B includes a plurality of unit sub cell arrays SCA. A plate line driving unit 431 for selectively driving a plate line PL by controlling decoding of the plate line PL is formed in one side of the plurality of sub cell array blocks 430.

The plurality of sub cell array blocks SCA_B arranged in the row direction and the plate line driving unit 431 are defined as a plate line array group PLAG. A plurality of plate line array groups PLAG are formed in the column direction.

One plate line array group PLAG(0) outputs a plurality of plate line driving signals PL<m> under the control of the plate line driving unit 431. Each of the plate line driving signals PL<m> drives one corresponding sub cell array block SCA_B.

That is, in the plate line array group PLAG(0), the plate line driving signal PL<0> drives the sub cell array block SCA_B(00) nearest to the plate line driving unit 431, and the plate line driving signal PL<m> drives the sub cell array block SCA_B(0m) farthest from the plate line driving unit 431.

Figure 10:
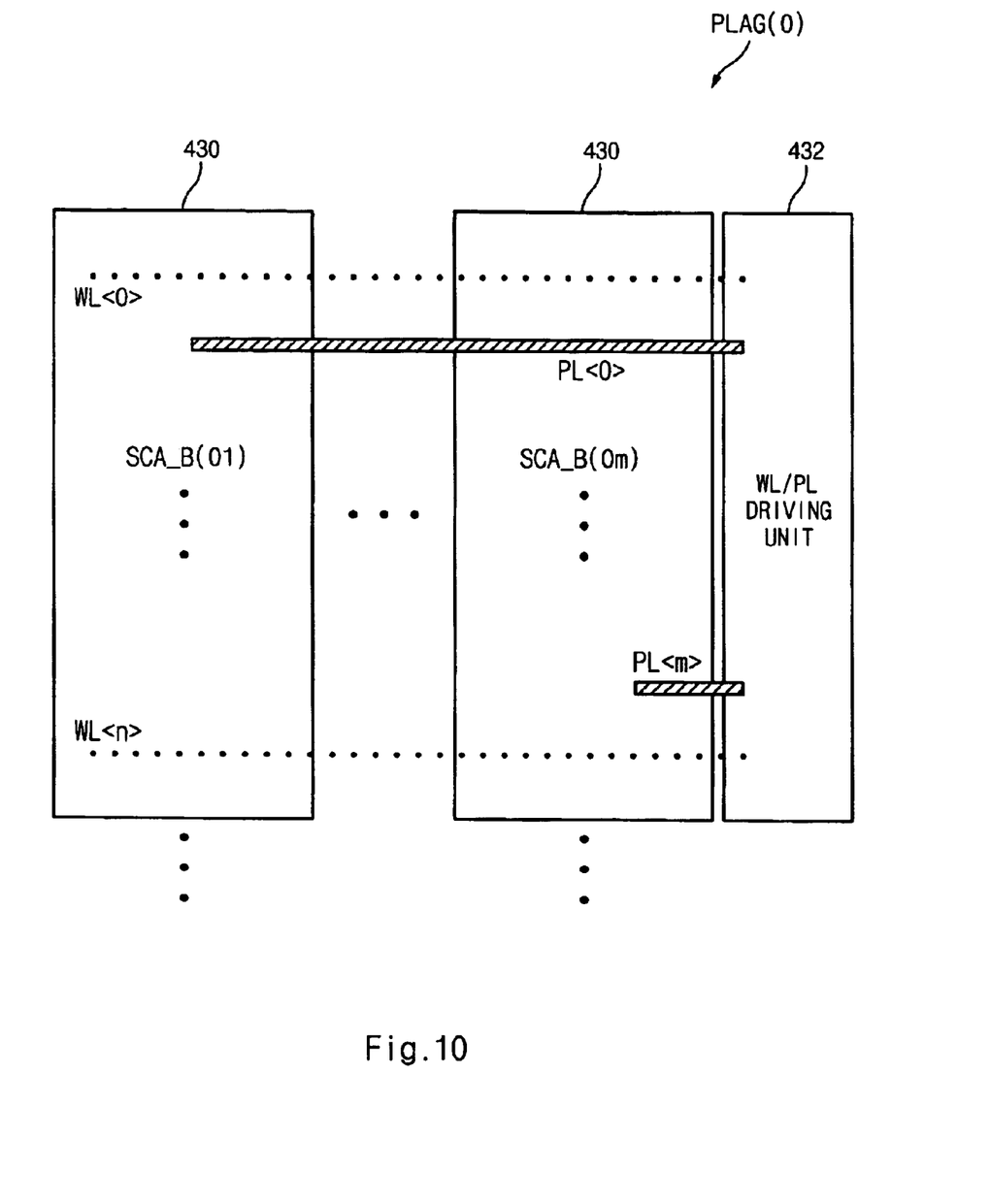

FIG. 10 is a structure diagram illustrating a plate line PL and word line WL array in the sub cell array block 430 in accordance with the present invention.

As illustrated in FIG. 10, a plurality of sub cell array blocks SCA_B are arranged in the sub cell array block 430. One sub cell array block SCA_B includes a plurality of unit sub cell arrays SCA. A word line/plate line driving unit 432 for selectively driving a plate line PL and a word line WL by controlling decoding of the plate line PL and the word line WL is formed in one side of the plurality of sub cell array blocks SCA_B.

The word line/plate line driving unit 432 outputs a plurality of word line driving signals WL<n> and a plurality of plate line driving signals PL<m>. Here, each of the word line driving signals WL<n> is commonly used by each sub cell array block SCA_B. That is, the word line driving signal WL<n> can drive the sub cell array block SCA_B(00) farthest from the word line/plate line driving unit 432 to the sub cell array block SCA_B(0m) nearest to the word line/plate line driving unit 432.

Each of the plate line driving signals PL<m> drives one corresponding sub cell array block SCA_B. That is, the plate line driving signal PL<0> drives the sub cell array block SCA_B(00) farthest from the word line/plate line driving unit 432. The plate line driving signal PL<m> drives the sub cell array block SCA_B(0m) nearest to the word line/plate line driving unit 432.

Figure 11:
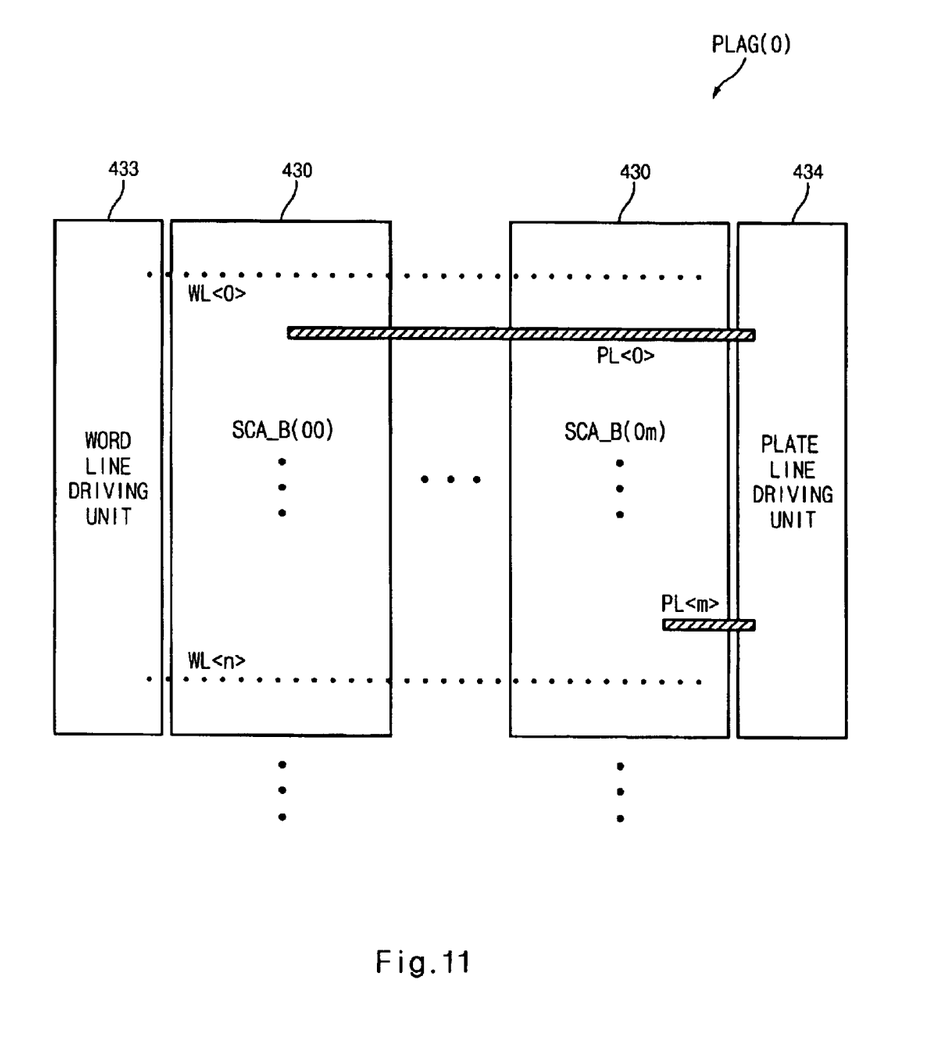

FIG. 11 is a structure diagram illustrating another example of the plate line PL and word line WL array in the sub cell array block 430 in accordance with the present invention.

As shown in FIG. 11, a plurality of sub cell array blocks SCA_B are arranged in the sub cell array block 430 in the row and column directions. One sub cell array block SCA_B includes a plurality of unit sub cell arrays SCA.

A word line driving unit 433 for selectively driving a word line WL by controlling decoding of the word line WL is formed in one side of the sub cell array block SCA_B. A plate line driving unit 434 for selectively driving a plate line PL by controlling decoding of the plate line PL is formed in the other side of the sub cell array block SCA_B. That is, the word line driving unit 433 and the plate line driving unit 434 are positioned in the opposite directions on the basis of the sub cell array block SCA_B.

The word line driving unit 433 outputs a plurality of word line driving signals WL<n>, and the plate line driving unit 434 outputs a plurality of plate line driving signals PL<m>. Here, each word line driving signal WL<n> is commonly used by each sub cell array block SCA_B. That is, the word line driving signal WL<n> can drive the sub cell array block SCA_B(00) nearest to the word line driving unit 433 to the sub cell array block SCA_B(0m) farthest from the word line driving unit 433.

Each of the plate line driving signals PL<m> drives one corresponding sub cell array block SCA_B. That is, the plate line driving signal PL<0> drives the sub cell array block SCA_B(00) farthest from the plate line driving unit 434. The plate line driving signal PL<m> drives the sub cell array block SCA_B(0m) nearest to the plate line driving unit 434.

Figure 12:
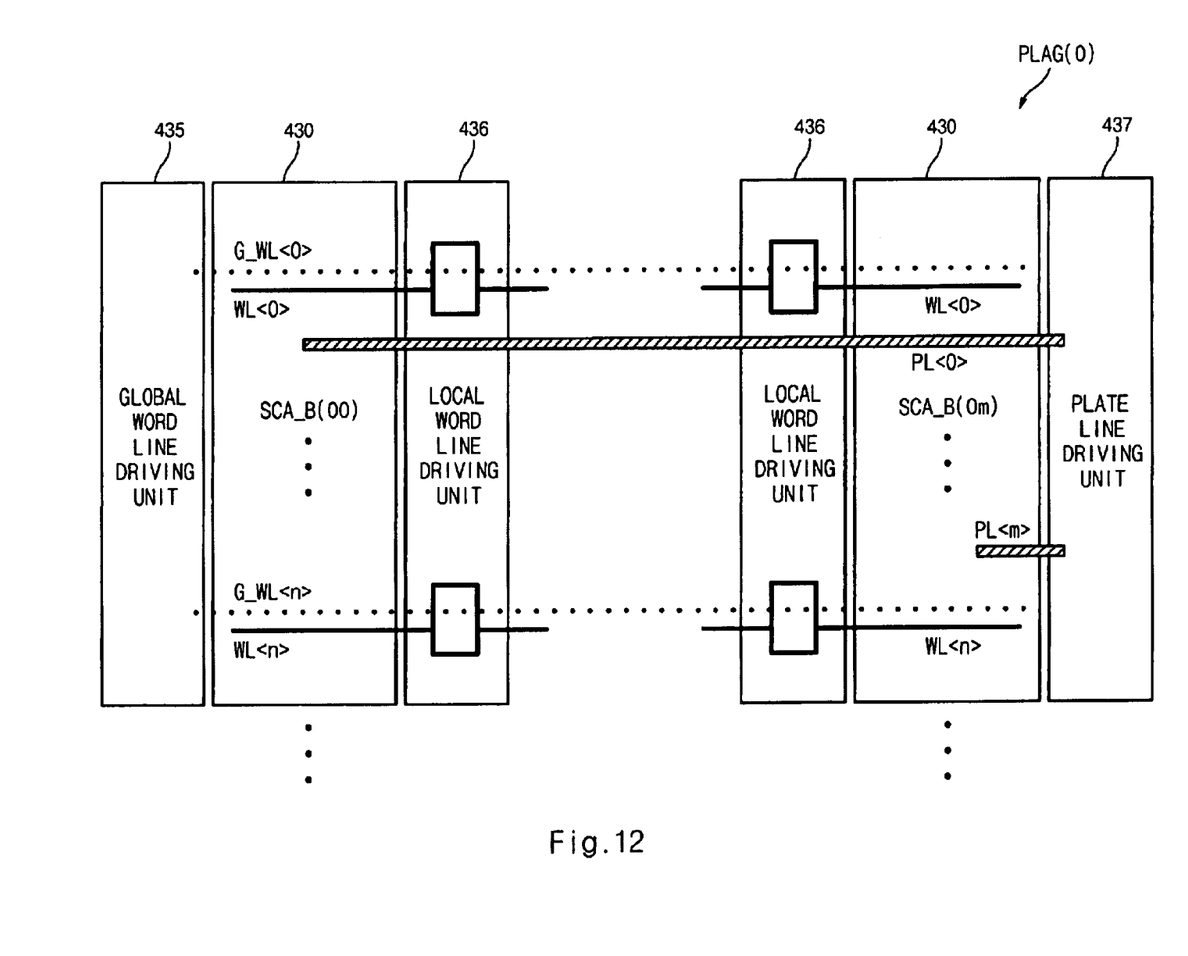

FIG. 12 is a structure diagram illustrating yet another example of the plate line PL and word line WL array in the sub cell array block 430 in accordance with the present invention.

Referring to FIG. 12, a plurality of sub cell array blocks SCA_B are arranged in the sub cell array block 430 in the row and column directions. One sub cell array block SCA_B includes a plurality of unit sub cell arrays SCA.

A global word line driving unit 435 for selectively driving a word line WL by controlling decoding of the word line WL is formed in one side of the sub cell array block SCA_B. A plate line driving unit 437 for selectively driving a plate line PL by controlling decoding of the plate line PL is formed in the other side of the sub cell array block SCA_B. That is, the global word line driving unit 435 and the plate line driving unit 437 are positioned in the opposite directions on the basis of the sub cell array block SCA_B. In addition, a plurality of local word line driving units 436 for controlling connection between global word lines G_WL are formed between the sub cell array blocks SCA_B.

The global word line driving unit 435 outputs a plurality of global word line driving signals G_WL<n>, and the plate line driving unit 437 outputs a plurality of plate line driving signals PL<m>. The local word line driving unit 436 outputs word line driving signals WL<n> for controlling word line connections between the sub cell array blocks SCA_B.

Here, each global word line driving signal G_WL<n> is commonly used by each sub cell array block SCA_B. That is, the global word line driving signal G_WL<n> can drive the sub cell array block SCA_B(00) nearest to the global word line driving unit 435 to the sub cell array block SCA_B(0m) farthest from the global word line driving unit 435.

Each of the plate line driving signals PL<m> drives one corresponding sub cell array block SCA_B. That is, the plate line driving signal PL<0> drives the sub cell array block SCA_B(00) farthest from the plate line driving unit 437. The plate line driving signal PL<m> drives the sub cell array block SCA_B(0m) nearest to the plate line driving unit 437.

In addition, each of the word line driving signals WL<n> drives the word line WL connected to one corresponding sub cell array block SCA_B. That is, the local word line driving unit 436 enables the word line WL for controlling the corresponding sub cell array block SCA_B according to the input of the global word line G_WL.

Figure 13:
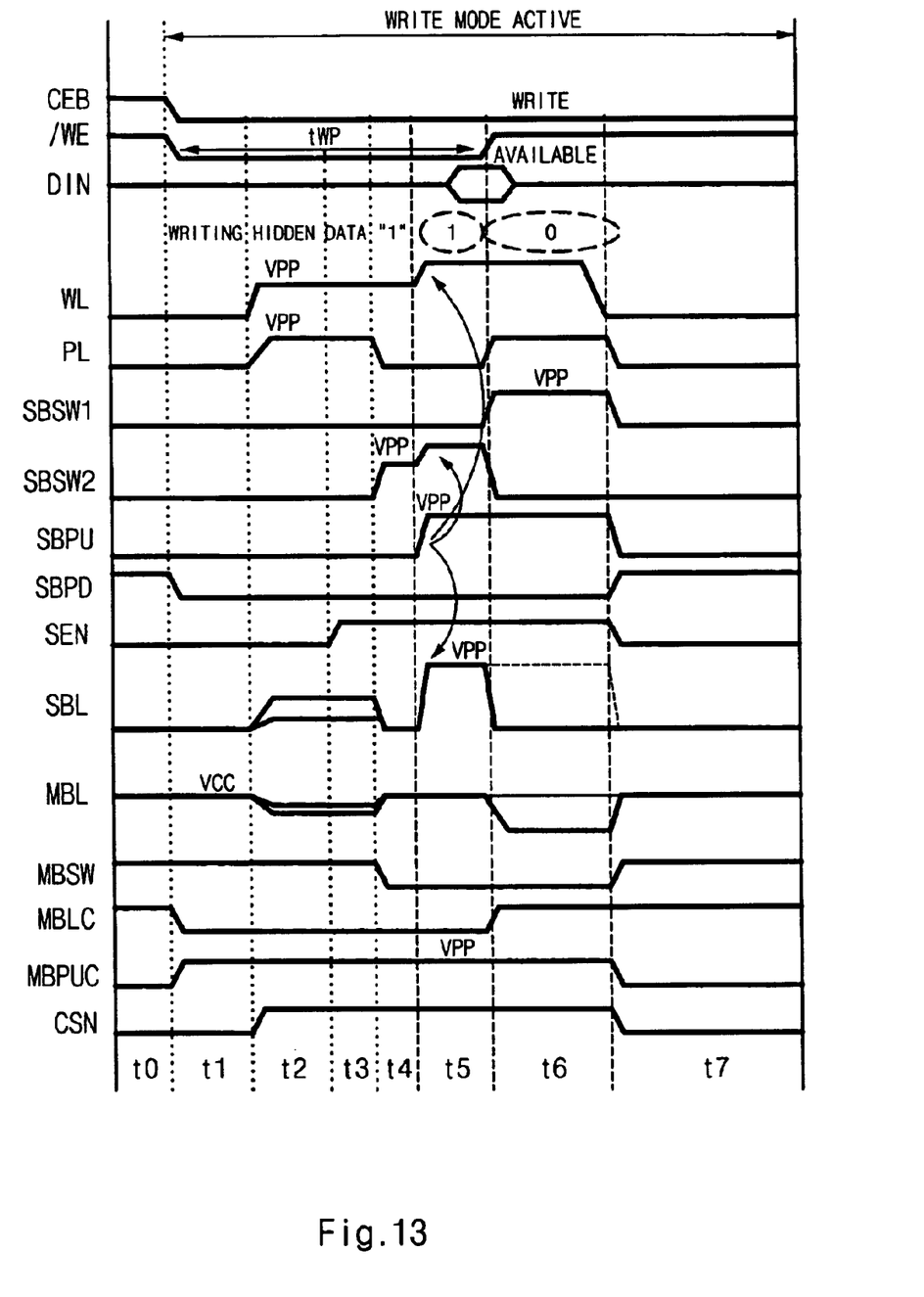
FIG. 13 is an operational timing diagram in a write mode of the FeRAM in accordance with the present invention.

FIG. 13 is an operational timing diagram in a write mode of the FeRAM in accordance with the present invention.

In T1 period, when the chip select signal CSB and the write enable signal /WE are disabled to a low level, the write mode is active. Here, the sub bit line pull-down signal SBPD and the main bit line control signal MBLC are disabled to a low level, and the main bit line pull-up control signal MBLPUC is enabled to a high level.

In T2 period, when the word line WL and the plate line PL are enabled to a pumping voltage VPP level, the voltage level of the sub bit line SBL increases. The column select signal CSN is enabled to connect the main bit line MBL to the common data bus unit 500.

In t3 period which is a data sensing period, the sense amp enable signal SEN is enabled to apply the cell data to the main bit line MBL.

In t4 period, the plate line PL and the sub bit line SBL are disabled to a low level, and the sub bit line select signal SBSW2 is enabled to a high level.

In t5 period, a hidden data '1' is recorded. In entrance of T5 period, the voltage of the word line WL increases, and the sub bit line select signal SBSW2 is enabled to the pumping voltage VPP level according to enabling of the sub bit line pull-up signal SBPU. Accordingly, the voltage level of the sub bit line SBL increases to the pumping voltage VPP level.

In t6 period, data can be recorded according to enabling of the write enable signal /WE. In entrance of T6 period, the plate line PL is re-enabled to a high level. The sub bit line select signal SBSW1 increases to the pumping voltage VPP level, and the sub bit line select signal SBSW2 is disabled. Here, the main bit line control signal MBLC is enabled to a high level.

Therefore, in the period when the sub bit line select signal SBSW1 has the pumping voltage VPP level, data can be recorded on the memory cell according to the voltage level transmitted to the sub bit line SBL and the main bit line MBL.

In t7 period, the word line WL, the plate line PL, the sub bit line select signal SBSW1 and the sub bit line pull-up signal SBPU are disabled. The sub bit line pull-down signal SBPD is enabled, and the sense amp enable signal SEN is disabled. In addition, the main bit line pull-up control signal MBLPUC is disabled, to precharge the main bit line MBL to the power voltage VCC level. Here, the column select signal CSN is disabled, to intercept connection between the main bit line MBL and the common data bus unit 500.

Figure 14:
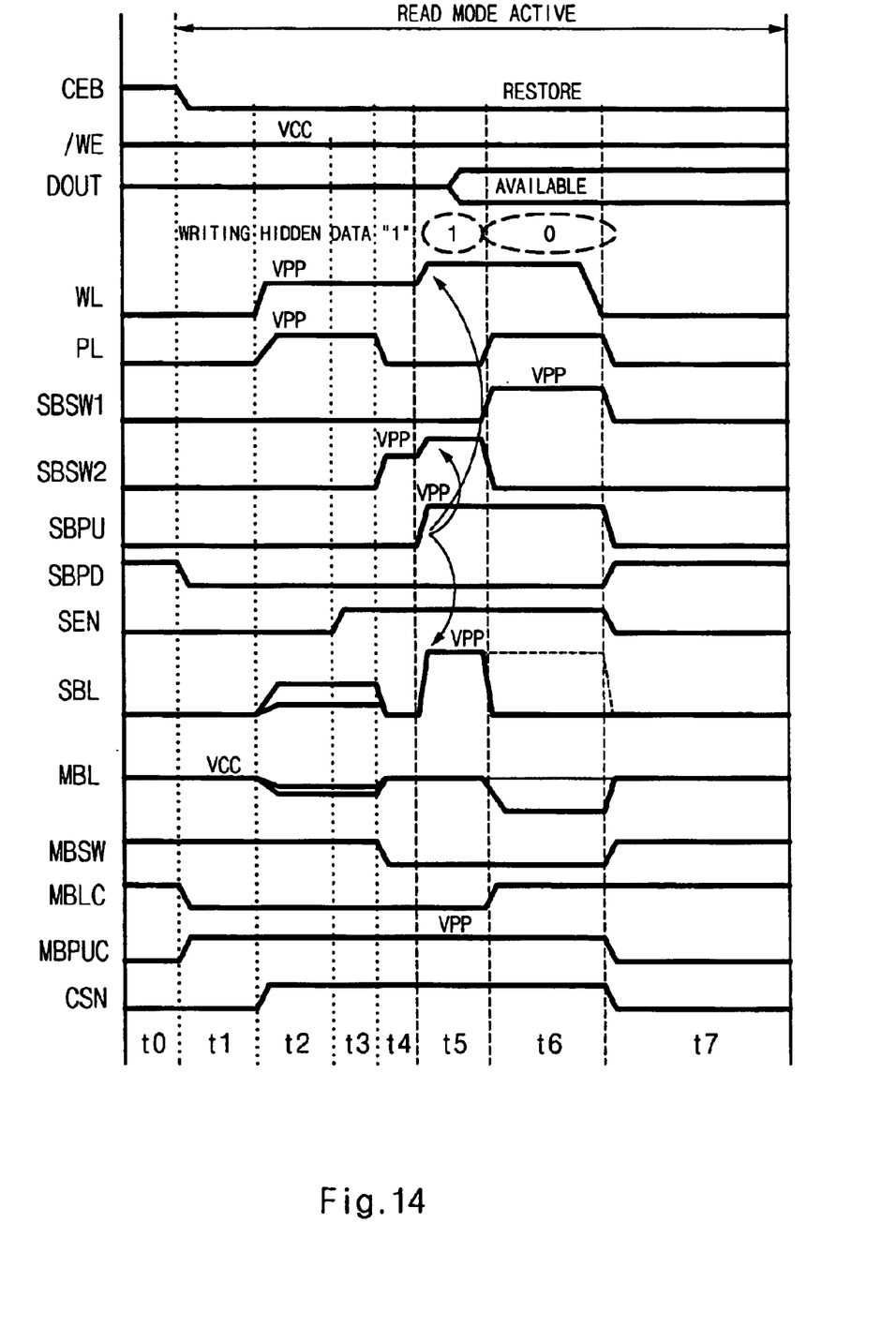
FIG. 14 is an operational timing diagram in a read mode of the FeRAM in accordance with the present invention.

FIG. 14 is an operational timing diagram in a read mode of the FeRAM in accordance with the present invention.

In the read mode, the write enable signal /WE maintains the power voltage VCC level. t2 and t3 periods are data sensing periods. The hidden data '1' is recorded in t5 period, and a data output valid period is maintained after t5 period.

The cell array blocks 400 and 402 do not record external data inputted through the common data bus unit 500 on the cell, but restore the read data stored in the timing data register array unit 300 in the cell.

In t6 period, the read data are restored again. That is, in the period when the sub bit line select signal SBSW1 has a high level, the voltage level is transmitted to the sub bit line SBL and the main bit line MBL by a feedback decoder loop. Accordingly, the read data are restored in the memory cell.

The data level stored in the cell array blocks 400 and 402 in t6 period is sensed and outputted through the common data bus unit 500.

As discussed earlier, the present invention provides the following advantages.

First, the high integration of the cell is achieved by sharing the plate line in sub cell array block units.

Second, the ferroelectric film is not damaged by preventing the ferroelectric substance from being exposed to plasma atmosphere in etching the plate line.

Third, the FeRAM is efficiently crystallized by forming the structure for covering the plate line which is the top electrode near the cell.

Fourth, the properties of the FeRAM are not deteriorated due to property distributions by positions in the cell array.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A ferroelectric random access memory, comprising a multi-bit line structure cell array for inducing a sensing voltage of a main bit line by converting a sensing voltage of a sub bit line into current, the ferroelectric random access memory comprising:

a unit sub cell array including at least one main bit line; a plurality of sub bit lines connected to one main bit line; and a plurality of unit cells which are connected to the plurality of sub bit lines, respectively, and selectively driven depending on a voltage level of a plurality of word lines, wherein each of the unit cells of the unit sub cell array shares a plate line.

2. The ferroelectric random access memory of claim 1, wherein the plurality of unit sub cell arrays compose one sub cell array block, and the plate line is shared by the plurality of unit sub cell arrays connected to the main bit line.

3. The ferroelectric random access memory of claim 2, wherein the plurality of sub cell array blocks are formed in a cell array block in the row and column directions.

4. The ferroelectric random access memory of claim 3, further comprising a plate line driving unit formed in one side of the plurality of sub cell array blocks, for driving the plate line in one sub cell array block unit by controlling decoding of the plate line.

5. The ferroelectric random access memory of claim 1, wherein the unit sub cell array comprises:

a plurality of bottom electrodes connected to storage nodes of switching devices included in each of the plurality of unit cells;

a ferroelectric layer stacked on the whole surface of the plurality of bottom electrodes;

a top electrode stacked on the ferroelectric layer; and a plate line stacked to be electrically connected to a predetermined area of the top electrode through a contact plug.

6. A ferroelectric random access memory, comprising a multi-bit line structure cell array for inducing a sensing voltage of a main bit line by converting a sensing voltage of a sub bit line into current, the ferroelectric random access memory comprising:

a cell array block having a plurality of sub cell array blocks to which a plate line is commonly connected; and a plate line driving unit formed in one side of the plurality of sub cell array blocks, for driving the plate line in one sub cell array block unit by controlling decoding of the plate line.

7. The ferroelectric random access memory of claim 6, wherein the sub cell array block comprises a plurality of unit sub cell arrays, and each of the unit sub cell arrays comprises:

a plurality of unit cells each respectively including a switching device and a ferroelectric capacitor;

a sub bit line connected to the plurality of unit cells through the switching devices;

a plurality of word lines for selectively driving the plurality of unit cells; and a main bit line controlled according to a sensing voltage from the sub bit line.

8. The ferroelectric random access memory of claim 7, wherein each of the plurality of unit sub cell arrays comprises:

a plurality of bottom electrodes connected to storage nodes of the switching devices included in the plurality of unit cells;

a ferroelectric layer stacked on the whole surface of the plurality of bottom electrodes;

a top electrode stacked on the ferroelectric layer; and a plate line stacked to be electrically connected to a predetermined area of the top electrode through a contact plug.

9. The ferroelectric random access memory of claim 6, wherein the plurality of sub cell array blocks arranged in the row direction and one plate line driving unit compose one plate line array group.

10. The ferroelectric random access memory of claim 9, wherein the plurality of plate line array groups are formed in the cell array block in the column direction.

11. The ferroelectric random access memory of claim 6, wherein the plate line driving unit outputs a plurality of plate line driving signals, each of the plate line driving signals driving one corresponding sub cell array block.

12. The ferroelectric random access memory of claim 6, further comprising a word line driving unit formed in the same direction as the plate line driving unit, for selectively driving a word line by controlling decoding of the word line.

13. The ferroelectric random access memory of claim 12, wherein the word line driving unit outputs a plurality of word line driving signals, each of the word line driving signals being commonly used in each sub cell array block.

14. The ferroelectric random access memory of claim 6, further comprising a word line driving unit formed in the other side of the plate line driving unit on the basis of the sub cell array block, for selectively driving a word line by controlling decoding of the word line.

15. The ferroelectric random access memory of claim 14, wherein the word line driving unit outputs a plurality of word line driving signals, each of the word line driving signals being commonly used in each sub cell array block.

16. The ferroelectric random access memory of claim 6, further comprising:

a global word line driving unit formed in the other side of the sub cell array block, for selectively driving a global word line by controlling decoding of the global word line; and a plurality of local word line driving units formed in each of the plurality of sub cell array blocks, for selectively controlling connection between the global word lines.

17. The ferroelectric random access memory of claim 16, wherein the global word line driving unit outputs a plurality of global word line driving signals, each of the global word line driving signals being commonly used in each sub cell array block.

18. The ferroelectric random access memory of claim 17, wherein the local word line driving unit drives the word line connected to one sub cell array block corresponding to the inputted global word line driving signal among the plurality of sub cell array blocks according to input of the plurality of global word line driving signals.

19. A ferroelectric random access memory, wherein a plurality of unit sub cell arrays comprise sub bit lines connected to a plurality of unit cells and a main bit line and compose one sub cell array block, each of the unit sub cell arrays comprising:

a plurality of bottom electrodes connected to storage nodes of switching devices included in the plurality of unit cells;

a ferroelectric layer stacked on the whole surface of the plurality of bottom electrodes;

a top electrode stacked on the ferroelectric layer; and a plate line stacked to be electrically connected to a predetermined area of the top electrode through a contact plug.

20. The ferroelectric random access memory of claim 19, wherein the plate line is shared by the plurality of unit sub cell arrays connected to each main bit line in one sub cell array block.

* * * * *